(12) United States Patent
Langhammer

(10) Patent No.: US 7,035,356 B1
(45) Date of Patent: Apr. 25, 2006

(54) EFFICIENT METHOD FOR TRACEBACK DECODING OF TRELLIS (VITERBI) CODES

(75) Inventor: Martin Langhammer, Poole Dorset (GB)

(73) Assignee: Altera Corporation, San Jose, CA (US)

( * ) Notice: Subject to any disclaimer, the term of this patent is extended or adjusted under 35 U.S.C. 154(b) by 944 days.

(21) Appl. No.: 10/032,597

(22) Filed: Oct. 25, 2001

Related U.S. Application Data

(60) Provisional application No. 60/245,880, filed on Nov. 3, 2000.

(51) Int. Cl.
*H04L 27/06* (2006.01)

(52) U.S. Cl. ............... 375/341; 375/340; 375/341; 714/795; 714/792; 714/45

(58) Field of Classification Search ............... 375/340, 375/341; 714/795, 792, 45
See application file for complete search history.

(56) References Cited

U.S. PATENT DOCUMENTS

| | | | | |
|---|---|---|---|---|
| 3,789,360 A | * | 1/1974 | Clark et al. ............ | 714/792 |
| 5,432,821 A | * | 7/1995 | Polydoros et al. ....... | 375/340 |
| 5,815,515 A | * | 9/1998 | Dabiri .................. | 714/795 |
| 5,940,416 A | * | 8/1999 | Nishiya et al. ......... | 714/795 |
| 5,946,361 A | * | 8/1999 | Araki et al. ............ | 375/341 |
| 6,507,921 B1 | * | 1/2003 | Buser et al. ........... | 714/45 |
| 6,690,750 B1 | * | 2/2004 | Hocevar et al. ........ | 375/341 |
| 6,788,750 B1 | * | 9/2004 | Reuven et al. ......... | 375/341 |
| 6,877,132 B1 | * | 4/2005 | De et al. ............... | 714/795 |

* cited by examiner

*Primary Examiner*—Stephen Chin
*Assistant Examiner*—Sudhanshu C. Pathak
(74) *Attorney, Agent, or Firm*—Beyer Weaver & Thomas, LLP

(57) ABSTRACT

Methods and apparatus are provided for efficiently implementing a traceback decoding of Viterbi codes. A Viterbi decoder circuit having at least two data selection blocks and at least two trace registers is described. The number of registers corresponds to the number of states in a Viterbi trellis diagram applicable to encoded data. The trace registers are used to represent the current state best metric and are each configured to send their output to the inputs of the predecessor states representing the possible branches to the current state. The best metric for the predecessor state is determined using a survivor vector stored in memory. Traceback occurs by sequentially reading survivor vectors from memory, using the vectors to control the data selection blocks, and using the trace registers to sequentially identify predecessor states in the traceback.

36 Claims, 13 Drawing Sheets

| INPUT BIT | INITIAL STATE | NEXT STATE | OUTPUT CODEWORD |
|---|---|---|---|
| 0 | 00 | 00 | 00 |
| 1 | 00 | 10 | 11 |
| 0 | 01 | 00 | 11 |
| 1 | 01 | 10 | 00 |
| 0 | 10 | 01 | 10 |
| 1 | 10 | 11 | 01 |
| 0 | 11 | 01 | 01 |
| 1 | 11 | 11 | 10 |

FIG. 1B  (PRIOR ART)

EVEN MUXES (0, 2, 4, 6)

ODD MUXES (1, 3, 5, 7)

EFFICIENT METHOD FOR TRACEBACK DECODING OF TRELLIS (VITERBI) CODES

CROSS-REFERENCE TO RELATED APPLICATIONS

This application claims priority of provisional U.S. patent application Ser. No. 60/245,880 filed Nov. 3, 2000, titled "Efficient Method for Traceback Decoding of Trellis (Viterbi) Codes", and which is incorporated by reference in its entirety.

BACKGROUND OF THE INVENTION

The present invention relates to a Viterbi decoder apparatus and to a Viterbi decoding method using survivor vector traceback methods.

In communications systems, data transmitted are often corrupted by noise or other distortions. As a result, the data obtained at the receiving station may not be an accurate replica of the transmitted data. To increase the reliability of the data received, redundancy in the form of error correction and error checking codes is often added to the transmitted signal to allow error correction by the receiving unit. The addition of the redundant information before transmission is known as a forward error correction ("FEC") technique. The redundant data is typically applied in an encoding block of the transmission circuit. A typical data communication system encodes the data before transmission, transmits the data through a noisy medium where the data may be corrupted, and processes the received encoded data in a Viterbi decoder where the encoded data is converted to its original format. As detailed further below, a Viterbi decoder moves forward through a sequence of received encoded data, determining a most likely path with respect to the transmitted codes and then performs a traceback on the most likely path to provide decoded data.

An encoder, an example of which is shown in FIG. 3, may produce several successive output bits which are correlated with one input bit. This correlation gives the coded data its error correcting capabilities. Shift registers and combinational logic which performs modulo-2 addition may be used, for example, to encode the data. The rectangular boxes labeled D0, D1, and D2 each represent one element of a serial shift register. The contents of the shift registers are shifted from left to right. The input X1 is used to load the shift register with a new input data bit as well as load the modulo-2 adders 302 and 304. The outputs from the modulo-2 adders are multiplexed to generate multiple coded digits of output for every binary digit (bit) that enters the encoder. For the encoder shown, the constraint length L is 3, which is defined as the number of bits used to encode the data.

Conceptually, each set of bits of encoded information may be represented by a state. The possible transitions from one state to a next state are limited. Each of these possible transitions can be shown graphically in a state diagram as depicted in FIG. 1A or in a similar manner by a transition table (FIG. 1B), or trellis diagrams (FIGS. 2A, 2B). Each possible transition from one state to a next state is defined as a branch. In the encoder, the state is represented by the most significant L−1 message bits moved into the encoder. The number of possible states for the encoder can be represented by the expression $2^{(L-1)}$ where L is the constraint length. Thus, when the constraint length is 3 as shown in FIG. 3, four states are possible. The convolutional encoder shown encodes at a rate of ½, meaning that the encoder outputs 2 data bits for every received input bit. As shown, a limited number of transitions to next state are possible from the current state, depending upon whether the input bit is a "0" or a "1".

All possible combinations of the initial state and the input digit are used to determine the next state and the output bits. Each of the four states, "00", "01", "10", and "11" are shown by the boxes 102–108. Transitions between states are represented by the connecting arrows between the rectangular boxes. The notation next to the arrows indicate the input bits followed by the output bits involved in the transition. For example, in transitioning from state "10", notation 110 indicates an input bit of "0" will result in the output bits "10" and a next state of "01" as indicated by box 106. The section of the trellis diagram depicted in FIG. 2 relates to a ½ convolutional encoder. The four possible states (00, 01, 10, and 11) are labeled alongside the left margin of the trellis. The four states labeled along the right margin represent the next state. Two lines or branches enter each next state and are typically referred to as the upper and lower branches. For example, as shown, state 10 has an upper branch feeding it from state 00 and a lower branch feeding it from state 01. The codeword, i.e., the group of output bits associated with the transition between states, is marked along the connecting branch line. For example, for the branch transitioning from state 01 to next state 10, notation 203 along the branch indicates an input of "1" that will result in an output codeword of "00" as the transition between the two states occurs.

The encoded transmitted data, after passing through a noisy channel, may be decoded at the receiver using a Viterbi algorithm. A Viterbi decoder, described in the overview which follows, is a maximum likelihood decoder providing forward error correction through the use of a Viterbi algorithm. Generally, in the decoding process, a Viterbi decoder works forward through the received sequence, and assigns a "cost" or "distance" to each state in that section of the trellis diagram, for each received word of the sequence. This cost is used to determine which previous state in the trellis was most likely to branch to the current state. The survivor vector (survivor) gives the indication as to which previous state was the most likely source, for example when there are two possible source states, whether the upper or lower source branch was the most likely previous state. More than 2 source states are possible and as known to those of skill in the art, the number of possible states depends on the encoding rate k (e.g. 2^k possible branches produce 1 survivor). The decoder then performs a traceback by working backward through the trellis, using the survivors to determine what the most likely path through the trellis was. The decoded bit is determined by the most likely source (i.e. oldest state in the trellis). The path is defined sequence of interconnected branches.

A trellis diagram, such as shown in FIG. 2B, is used to determine a most likely path, i.e. a path having a distance nearest to a transmitted series of encoded bits. The trellis diagram depicts the paths stretching out from the states at an initial time instant, with subsequent time instants arranged in the horizontal direction. Thus, the trellis diagram may be used to show the time arrangement of the states. The trellis depth of a trellis diagram represents the number of sections in the diagram. For example, the trellis depth for the Viterbi trellis shown in FIG. 2B is 5.

Any state and time may be represented in the Viterbi trellis diagram by a node, such as node 222 representing state 1 at time t=3. The various times are represented along the horizontal axis. In order for the Viterbi decoding circuit to determine a most likely path from the received encoded data, for each node an accumulated metric is typically determined. The lines connecting the nodes or states are identified as branches. For each branch from a state, a branch metric is determined. One way of defining the branch metric is the Hamming distance between the received codeword and the branch codeword, which is the number of differences between the codeword (or bits) received by the communications system and the branch codeword such as example codeword 224. The branch codeword represents the output bits generated when the transition between the current state and the next state occurs. Other measures, such as the square of the distance, may be used as alternatives to determine the branch metric.

For each node representing a next state, the new accumulated path metric is the sum of the branch metric and the accumulated metric for the source of the branch. In the example shown in FIG. 2B, two branches enter each node. Only one of the branches will survive. The surviving branch is determined by comparing, for each of the two branches, the sum of the source node's accumulated path metric and the branch metric for that branch. The surviving branch may be represented by the lower of the two sums or the higher of the sums, depending on the method. For example, in situations where the Hamming distance is not measured but rather the correlation between the received value and branch codeword is used to determine the branch metric, the highest value is selected. If the sums for the branches are equal, any branch may be randomly selected as the survivor. The sum for the surviving branch then becomes the accumulated path metric for the destination node (next state). These steps are repeated for each state in each section of the trellis diagram until the end of the Viterbi trellis diagram is reached. Typically, an add-compare-select ("ACS") circuit determines the surviving branch in this forward movement through the Viterbi diagram.

In order to generate the decoded bits, a traceback is performed from the final state, often by initially selecting as the starting point the final state with the minimum accumulated metric. In the traceback, a minimized path is selected from the final state to the initial state (represented by the first or leftmost trellis section). In this reverse direction, the path from each node travels along the survivor branches. In the reverse direction only one surviving path or branch leaves each node, i.e. the survivor branch. The traceback therefore provides a funneling action (in the reverse direction) which directs the traceback along the minimized path. After the calculation of the path metrics in the forward direction, every state has one surviving branch terminating at it. This intermediate state may, however, have more than one surviving branch leaving it. But, given a sufficient number of steps in the traceback, all possible paths are expected to converge to one path. The number of steps or the trellis depth is typically selected to be at least 5*L, where L is the constraint length of the code, but may be as high as 15*L for punctured codes. Typically, only the oldest message bit within the Viterbi trellis diagram is decoded, i.e. the output codeword corresponding to the traceback path in the first or leftmost section of the trellis diagram. The contents of the Viterbi trellis diagram may then be shifted by one code trellis position to the left to vacate a position for the next pair of encoded digits received from the communications channel. This process continues until all bits have been decoded.

In order to implement the Viterbi decoder in hardware, a large number of storage registers are typically used. Given a trellis depth of 35 for decoding, for example, it can be seen that the hardware required by a conventional implementation may exceed the capacity of many devices, such as programmable logic devices or alternatively require the selection of high capacity devices at an increased cost. Moreover, each time a bit is decoded using conventional methods, a complete traceback of the trellis diagram is typically required. The resulting problems include extensive hardware requirements, considerable time in performing the computations, or a combination of these problems. While reducing the traceback depth can present considerable savings in computational time and hardware requirements, such reductions can introduce inaccuracies in the decoded data. What is needed is an implementation that will efficiently permit Viterbi decoding to be performed using limited hardware such as might be available from a single layer in a programmable logic device ("PLD") or to permit high speed decoding without sacrificing the accuracy attainable using current traceback depths.

SUMMARY OF THE INVENTION

The present invention provides a method and apparatus for efficiently implementing a traceback decoding of Viterbi codes. In one embodiment, a serial configuration permits traceback to occur in one level of logic. In another embodiment a multiple memory configuration is employed to permit high speed decoding in the traceback. Provided is a Viterbi decoder circuit having at least two data selection blocks and at least two trace registers, the number of registers corresponding to the number of states in a Viterbi trellis diagram applicable to encoded data. The trace registers are used to represent the current state best metric and are each configured to send their output to the inputs of the predecessor states representing the possible branches to the current state. The best metric for the predecessor state is determined using a survivor vector stored in memory. Traceback occurs by sequentially reading survivor vectors from memory and selecting the predecessor state based on the survivor vector values, using the vectors to control the data selection blocks.

In one embodiment, a Viterbi decoder has at least two data selection blocks, each having at least 2 inputs, an output, and control circuitry. The decoder also has at least two trace registers, each having an input and an output. The output of each is connected to one of the data selection blocks, the connection corresponding to a possible path in a traceback of the Viterbi trellis. Each trace register receives its input from a corresponding data selection block. In one embodiment, the predecessor best metric state is determined by reading the survivor vector and using the value to control a select line on the data selection blocks.

In another embodiment, the survivor vector values are read from a memory having at least two ports. The survivor vector values correspond to survivor vectors read in a forward movement in Viterbi trellis. In yet another embodiment, at least two decoded bits are generated during each traceback cycle, the second of the decoded bits based on a traceback length one larger than the immediately preceding decoded.

In yet another embodiment, a Viterbi decoder is provided having at least two memory blocks having at least two ports. Survivor vectors are written simultaneously to each of the at least two memories. The decoder is configured to read the survivor vectors and to decode multiple bits per traceback in blocks, alternately from each of the dual port memory blocks to produce a continuous output of decoded data.

BRIEF DESCRIPTION OF THE DRAWINGS

The features and advantages of the present invention are illustrated by way of example, and by no means are intended to limit the scope of the invention to the particular embodiments shown, and in which:

FIG. 1B is a state transition table illustrating the transitions between states for a sample convolutional encoder.

DETAILED DESCRIPTION

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In one embodiment, the present invention provides a method and apparatus for implementing a Viterbi traceback decoder that requires less hardware than conventional implementations. In another embodiment, multiple memories having at least two ports are utilized to implement a continuous traceback circuit which better optimizes the decoding rate with the generation rate for survivor vectors.

Figure 4A:
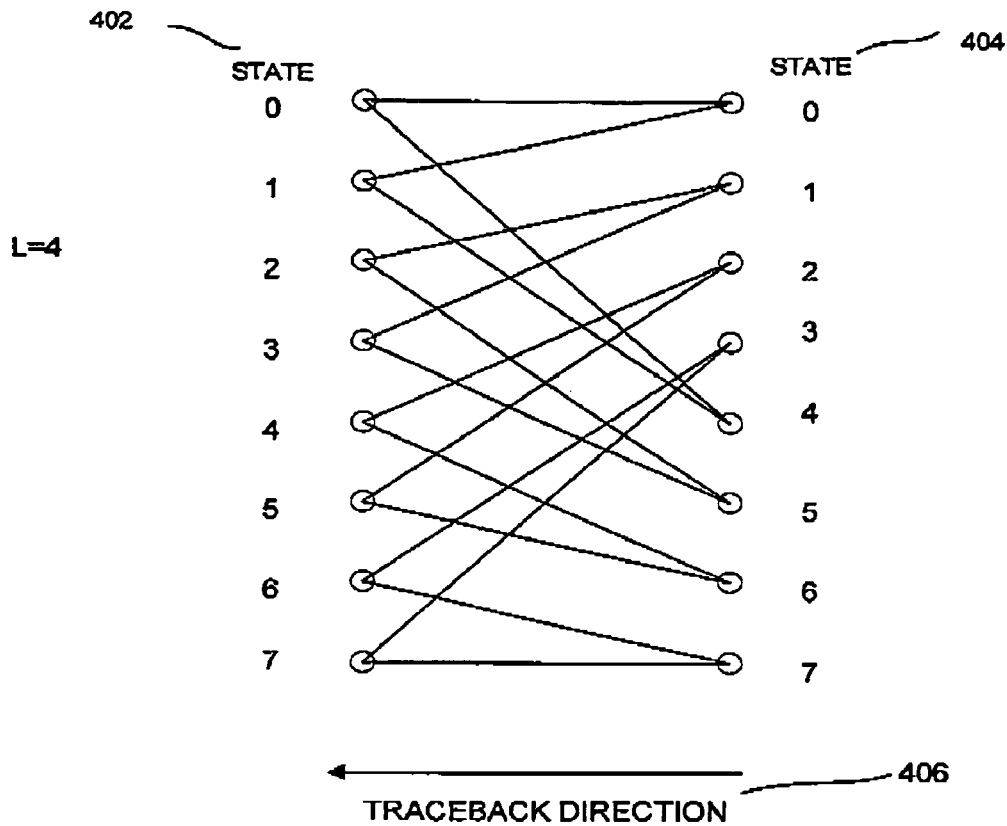
FIG. 4A illustrates an example trellis section with a constraint length of four.
Figure 4B:
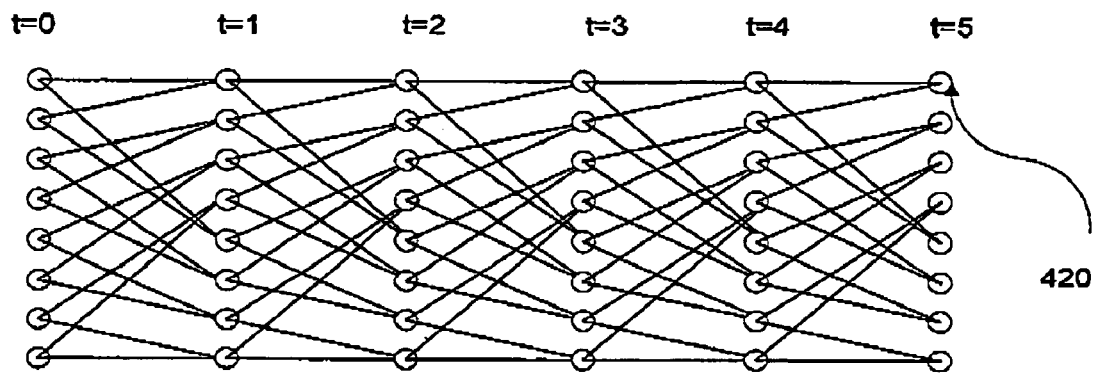
FIG. 4B illustrates a Viterbi trellis diagram.

FIGS. 4A, and 4B illustrate a section of a trellis diagram and a diagram with multiple sections having 8 states. FIGS. 5, 5A, 6, 7, 8, and 10 illustrate in schematic form various aspects of hardware used in various embodiments to perform the traceback portion of the Viterbi decoding. FIG. 4A illustrates a conventional section of a trellis diagram showing potential transitions between current states 402 (000, 001, . . . 111) and next states 404. Since the constraint length is 4, 8 different states are possible.

As explained above, the traceback occurs in the reverse direction. This is illustrated by arrow 406 in FIG. 4A. Typically, in laying out the traceback path, the best metric for the final state is used as the starting point. Alternately, the initial state for the traceback may be selected as state 0 or selected randomly. In the example, each starting node has 2 source states. However, only one of those 2 source states will have the best metric for the previous time interval.

The present invention uses a survivor vector for the current state to determine which of the previous source states (predecessor states) has the best metric. For example, as illustrated in FIG. 4A, states 0 and 1 are the source states for state 4. If state 4 represents the current best metric, the previous best metrics must lie in either state 0 or state 1. In the traceback (reverse) direction, state 4 can be described as feeding states 0 and 1. FIG. 4B illustrates a trellis diagram of traceback depth v=5. In performing the traceback, the path is initiated in a next state of the final trellis section. For example, one such state might be node 420, representing state 0 at time t=5.

Figure 5:
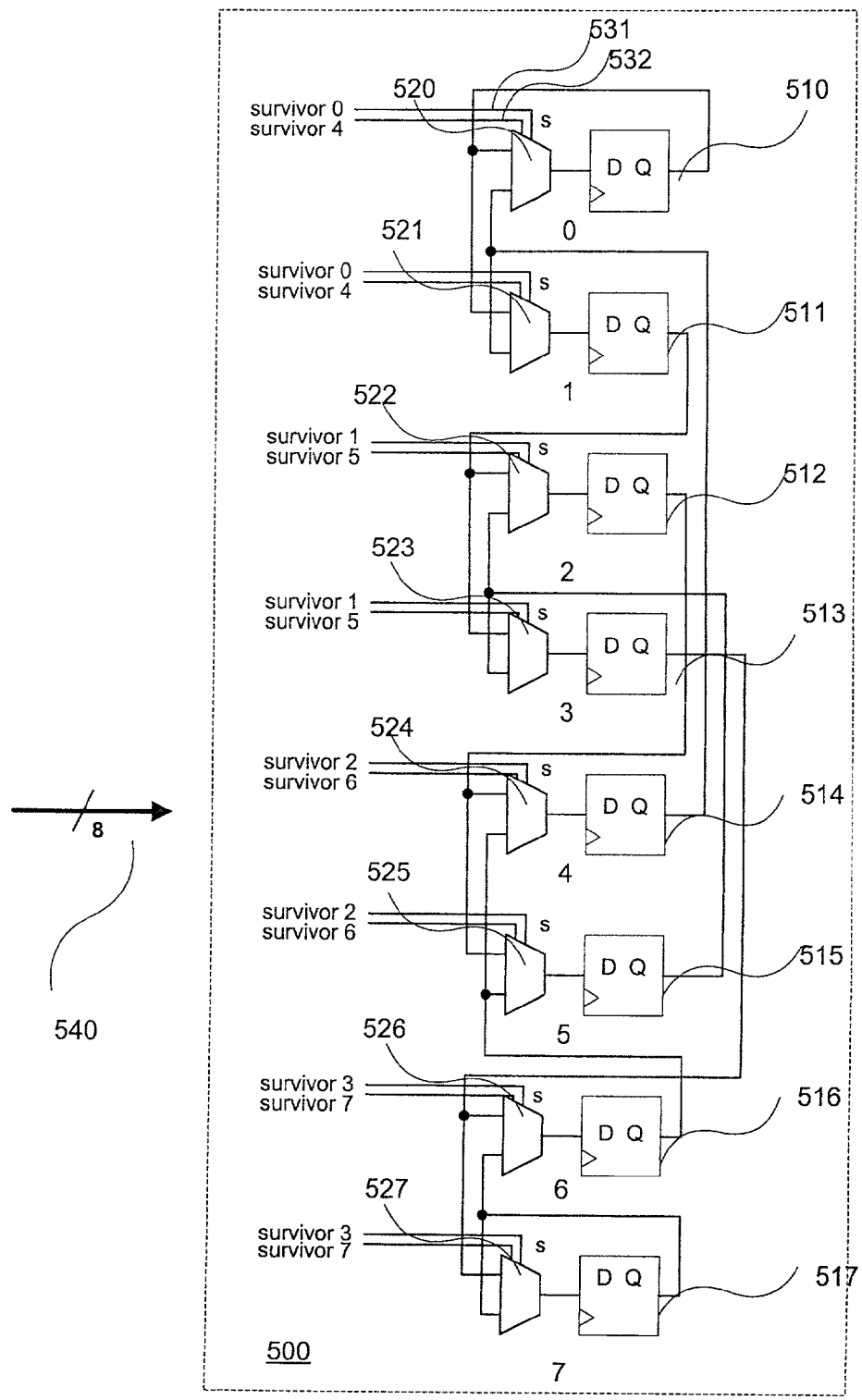
FIG. 5 illustrates traceback logic circuitry in accordance with one embodiment of the present invention.

FIG. 5 illustrates a circuit implementing the traceback for the trellis section in accordance with one embodiment of the present invention. Trace registers 510–517 are clocked storage registers which correspond to states 0–7. In this example, they are representative of the bit values held in the various nodes, such as depicted in the trellis diagram of FIG. 4B. As indicated in the traceback diagram, these states will feed the previous states. For example, next state 4 will feed either previous state 0 or 1, depending upon which of the two states (0 or 1) had the previous best metric. In like manner, the output of register 514 (state 4) is hardwired to the multiplexers ("muxes") (520, 521) for states 0 and 1. Through the use of clocked trace registers and data selection blocks (e.g. muxes), in one example, the circuit of FIG. 5, evaluated over several clock cycles, is used to perform the traceback function defined by a Viterbi trellis.

Figure 5A:
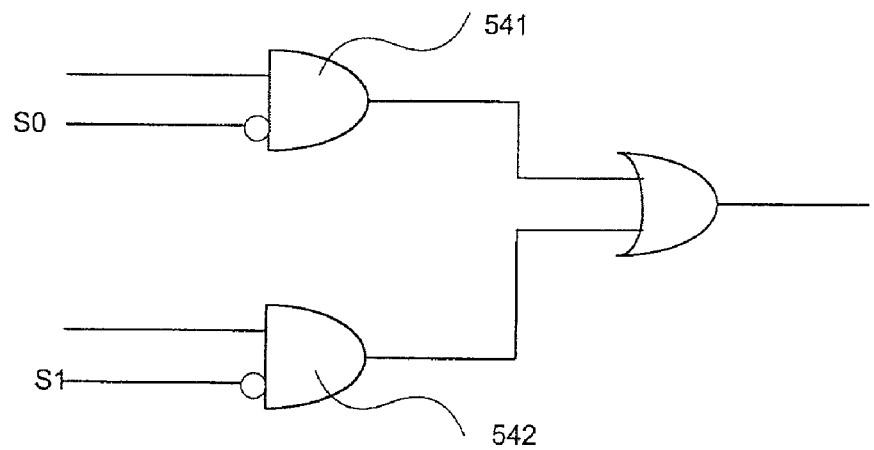
FIG. 5A illustrates combinational logic circuitry in accordance with one embodiment of the present invention.
Figure 5A:
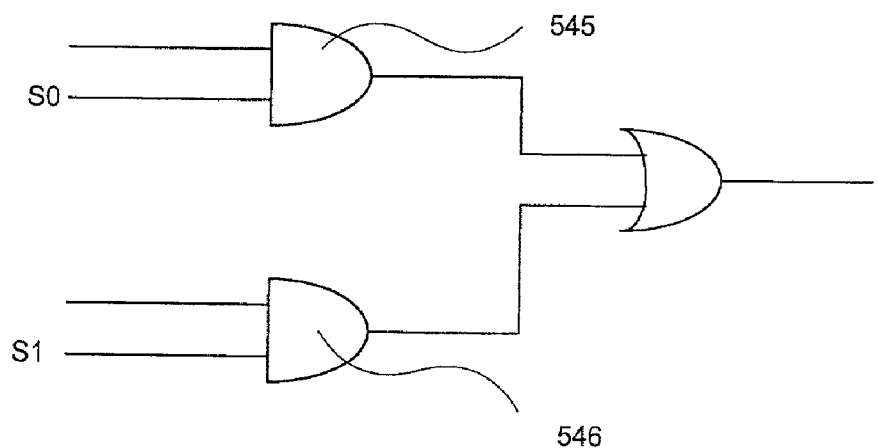

The select line of the muxes is controlled, in one embodiment, by selected bits in the survivor vector for that time instant in order to determine which of the hardwired previous states represents the survivor branch. The signal lines transmit the values for the survivor to the select lines of the muxes (or comparable lines of any suitable data selection block used) to control the output of the muxes. In one example, as illustrated in FIGS. 5 and 5A, two survivor vector bits are used to control the select lines for each mux. FIG. 5A illustrates one example of combinational logic which may be used for the select lines of the muxes. FIG. 5A illustrates the functioning of the muxes with lines $s_0$ and $s_1$ representing the select lines of the muxes, such as, for example, lines 531,532 as depicted in FIG. 5. The appropriate survivor vector values are communicated over these lines to the muxes. In this embodiment, the use of "AND" gates 541, 542 with inverted select line inputs (for use on even muxes e.g. 0, 2, 4, and 6) coupled with "AND" gates 545,546 having noninverted select line inputs, enables survivor vectors to designate an upper surviving branch with a "0" value and a lower surviving branch with a "1" value.

For example, if state 4 has the best metric for that time interval depicted by the trellis diagram, only state 4 will have a "1" at the input of its register. On the next clock cycle, the "1" is transmitted to the muxes (520, 521) for states 0 and 1. The survivor vector 540 for the current state contains the information necessary to determine which one of states 0 and 1 represent the best metric for the previous state. In the example illustrated in FIG. 5, the survivor vector 540 for the current state will comprise an 8-bit vector with the value in the bit location corresponding to each of the states indicating whether the surviving branch is the upper branch (state 0), for example denoted by "0" in the appropriate vector bit position or the lower branch (state 1) denoted by "1". The correlation between the values in the survivor vector and the selection of the upper or lower branch may be reversed and the designation of survivor vectors provided by other bit values without departing from the spirit of the invention. Additional bits per state may be required when the branches entering a state exceed 2. In this example, the select line of the muxes is controlled by the two adjacent survivor vector bit of the current state representing the best metric. For example, in the traceback direction shown, state 4 feeds the input muxes 520 and 521 for D flip flops ("DFF's") 510 and 511 (states 0 and 1). The survivor vectors bits 0 and 4 ("survivors 0 and 4"), representing the survivor vector bits for the current states' best metrics, will control the select line(s) of the muxes. In this manner, the survivor vector bit values will enable selection of the correct surviving branch from the previous state to find the best metric of the previous state.

For one embodiment, similar connections are made for the muxes to states 2 and 3 (muxes 522, 523 use survivors 0 and 4), states 4 and 5 (muxes 524, 525 use survivors 2 and 6), and states 6 and 7 (muxes 526, 527 use survivors 3 and 7). Accordingly, the "1" at the input of mux 520 will be propagated to the input of DFF 510 and a "0" at the input of mux 521 will be propagated to the input of register 511. Thus, during the next clock cycle only register 510 will have an active state at its input signifying the best metric for the previous time interval. These steps are repeated during each clock cycle until traceback is completed. The example shown was based on a code rate k/n=½, where k bits are input into the encoder and n bits are output. As would be recognized by those of skill in the art, $2^k$ branches leave (and enter) each node. For example, where the coding rate is k=1, 2 branches leave a node and 2 branches terminate at a node. Where the coding rate is k=2, 4 branches enter and leave each node. The survivor vector will have k bits per state and the muxes into each state DFF will have $2^k$ inputs. Although the diagrams and description have described embodiments having 2 inputs into each data selection block (mux), the invention is not limited to 2 input branches. The number of branches are a function of the coding rate k and the invention is also intended to cover multiple branches (e.g. 4, 8, or more) input into each data selection block.

The traceback logic circuit 500 shown in FIG. 5 provides advantages over conventional hardware circuits in that it requires minimal hardware and may be implemented, for example, in one level of logic. This may equate to, for example, implementation in one physical layer in programmable logic devices (PLD's). In order to complete the traceback path, one clock cycle is required in one embodiment for each trellis section in the Viterbi trellis diagram. Thus, where "v" represents the traceback length, v clock cycles will be required for a complete traceback operation. A range of different values may be used for v in order to obtain convergence although the value of 5*L is often used.

Figure 6:
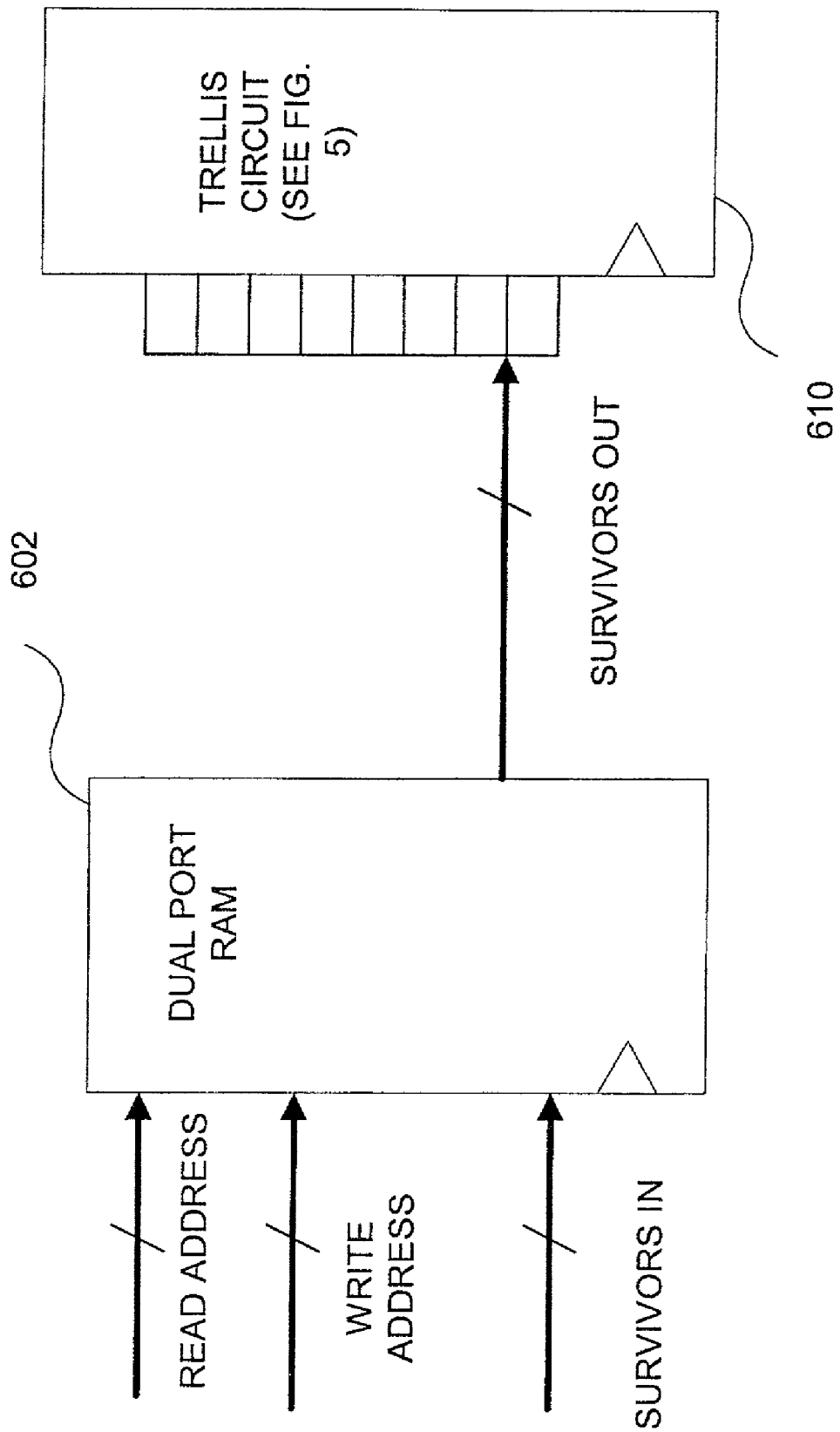
FIG. 6 illustrates a dual port memory for survivor vectors in accordance with one embodiment of the present invention.

As discussed in the background, the survivor vectors for each time instant are determined conventionally using an ACS circuit and stored in memory. In one embodiment, the surviving vectors are written to dual port RAM 602 set up as a circular buffer of v depth as shown in FIG. 6. The survivor vectors are output to the trellis circuit 610 (an example of which is the traceback logic circuit 500 shown in FIG. 5) and together are used to perform a traceback during v clock cycles in the serial traceback decoder. The traceback commences with the survivor vector obtained at the current address of the circular buffer RAM and counts down until it has wrapped around and reached the current address−v, which is also the current address+1.

One problem addressed by the current invention is a possible mismatch between the survivor vector generation rates (for example from conventional ACS units) and the decoding rate. Where L is the constraint length, in one embodiment one survivor vector containing $2^{(L-1)}$ bit (e.g. 8 bits for a constraint length of 4) is generated per symbol set received. This corresponds to the number of states shown by the trellis diagram. A serial processing Viterbi decoder requires $2^{(L-1)}$ clock cycles per symbol set received to generate each new survivor vector. Thus, using a typical value for the constraint length as 7, more clock cycles would typically be required to calculate the survivor vector than to perform the traceback. Performing the traceback typically requires 5*L clock cycles, where L is the constraint length.

However, the traceback may consume more time than calculation of the new survivor vector. This may occur when v is large or an alternate decoder architecture is used where a small number of clocks is needed to generate a survivor vector. To address this situation, more than one bit per traceback may be decoded. This may better match the traceback rate with the survivor vector generation rate. In one embodiment of the present invention, where $v>2^{(L-1)}$, decoding more than one bit per traceback cycle provides better matching and increased throughput. The last X best metrics may be decoded to increase the traceback throughput. X may be defined as follows:

$$X = \lceil v/\# \text{ of clocks per session} \rceil$$

For example, if v=52, and the number of clocks to calculate a new survivor vector is 16, then X=4, representing the quotient rounded up to the next integer of the traceback depth divided by the number of clocks. Therefore, 4 bits must be calculated per traceback so that no bits are omitted. This situation provides a greater traceback depth for the 4$^{th}$ bit decoded compared to the first, but still allows each of the bits to be decoded using at least the specified minimum traceback depth.

However, for example, traceback may not always commence immediately after all survivors had been written to a memory coupled to the trellis circuit. For example, if L=5 (16 survivors) and v=52, we would decode 4 (by rounding up (52/16)) bits per traceback, but only start the traceback every 4$^{th}$ cycle and decoding 1 bit per cycle, yielding 4 bits. During the traceback the last operation is stopped at the current buffer write address. If "x" bits are decoded, the operation is stopped after (v−x) reads, since "x" survivor writes will have occurred during this time and the reading of the new "x" survivor values should be avoided during the current traceback cycle.

Thus, using the example described above, the last 4 steps of the traceback decode a bit. The traceback depth is 52−x because by the time traceback of 48 spaces has occurred, 4 new survivor vectors have been written into the circular buffer (where 4,3,2,1 would have been located). Because of the presence of the 4 new survivor vectors the traceback is stopped somewhat short of the buffer depth. To compensate for the shortened traceback, x+v may be added internally to select a new v value.

Figure 7:
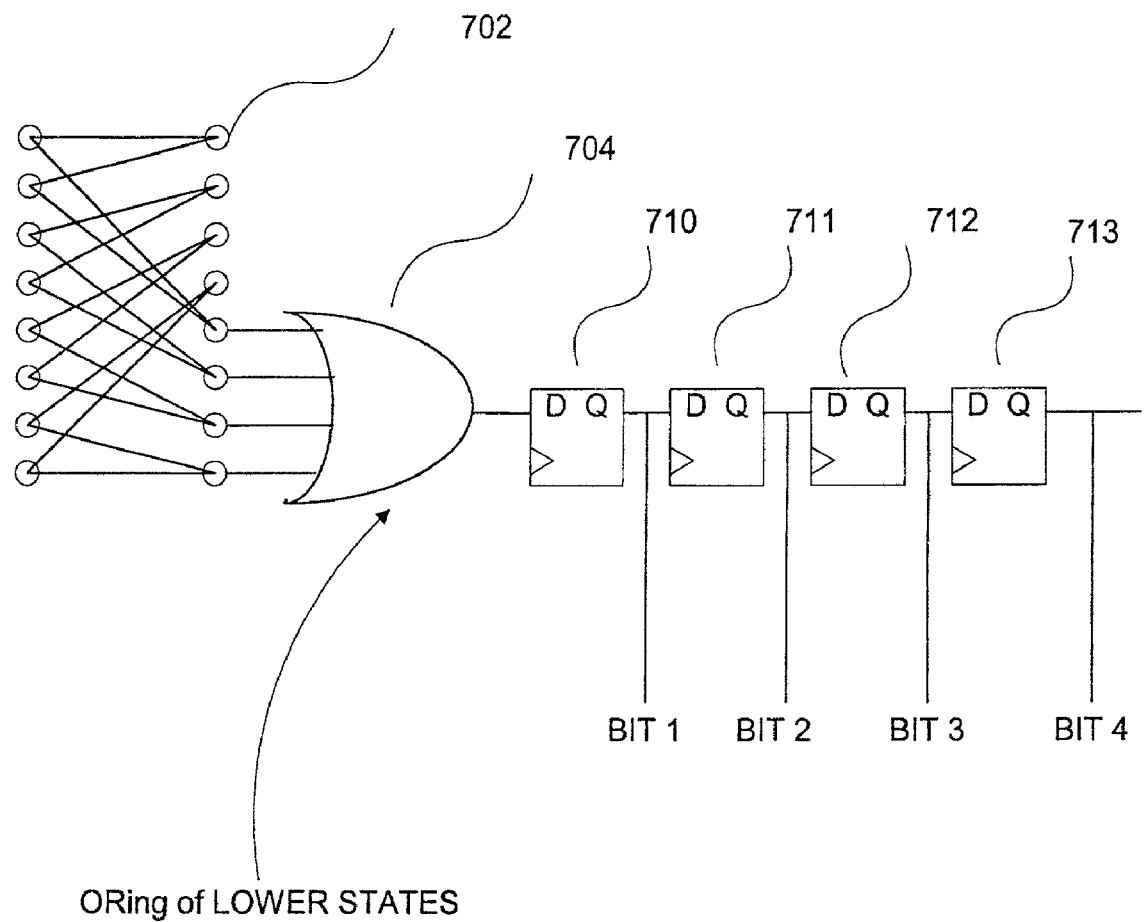
FIG. 7 illustrates traceback decoding circuitry in accordance with one embodiment of the present invention.

As shown in FIG. 7, decoding multiple bits per traceback may be accomplished by decoding the last X best metrics. This produces bits in a backward order but this is corrected by using a shift register (registers 710–713) to reorder the bits.

Figure 1A:
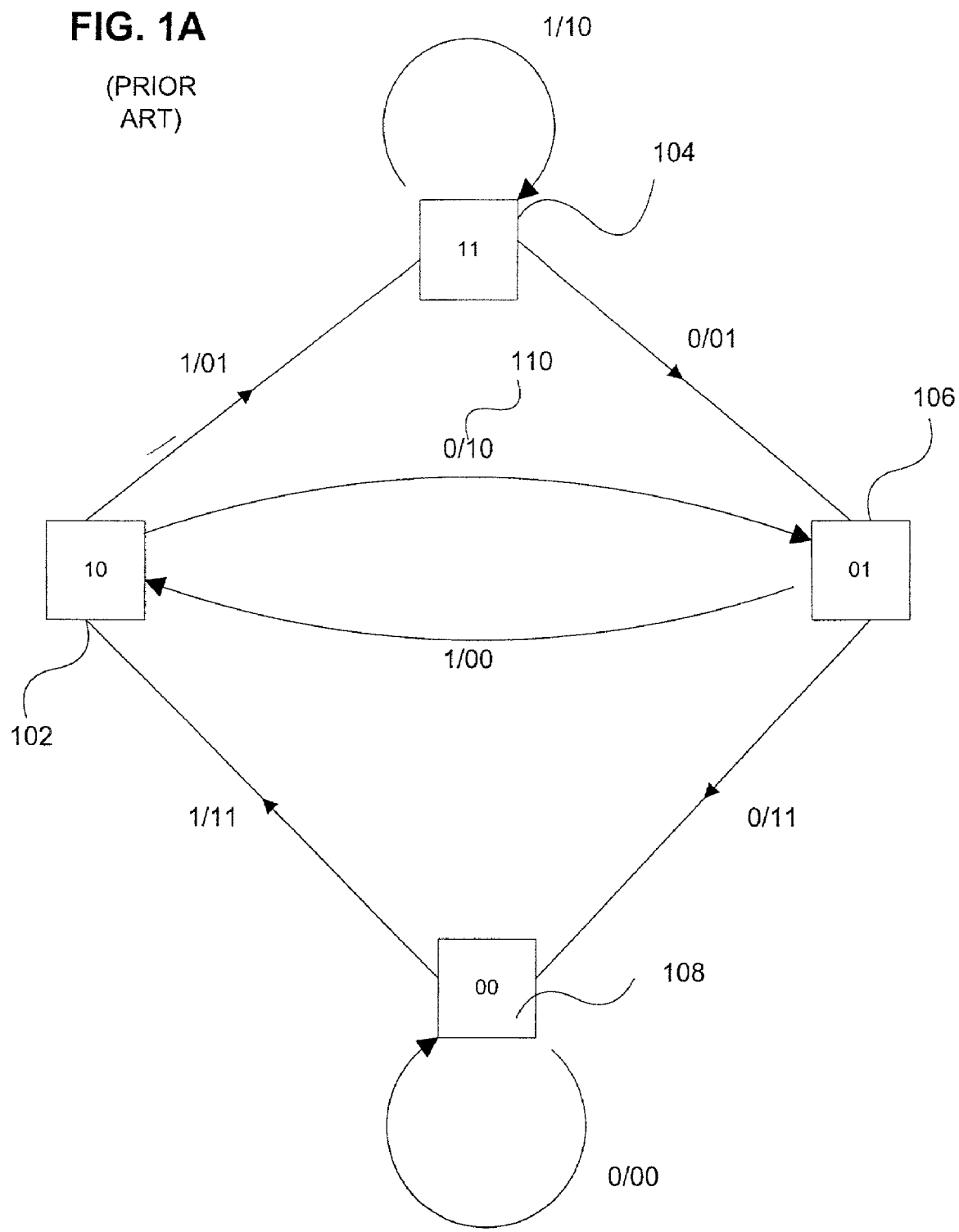
FIG. 1A is a state diagram illustrating the transitions between states for a sample convolutional encoder.
Figure 2A:
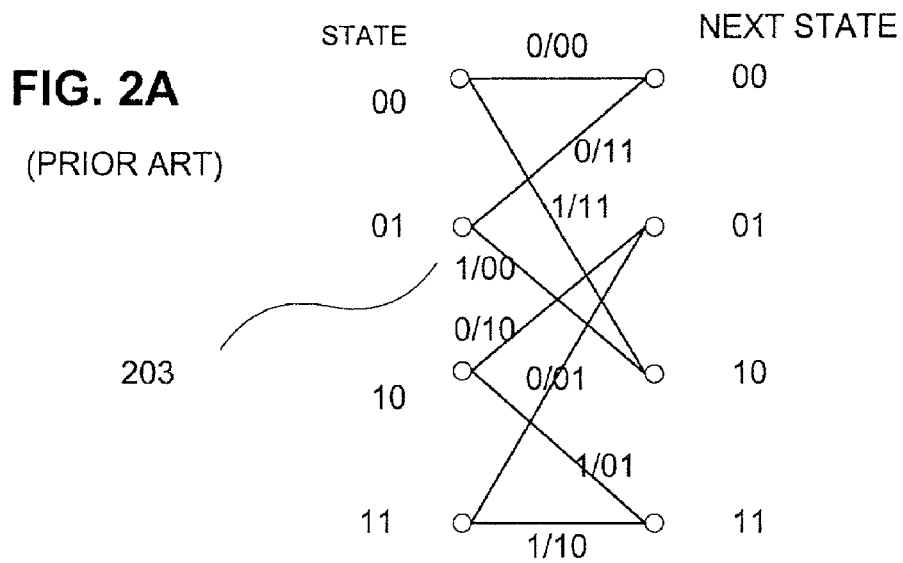
FIG. 2A is a trellis section illustrating transitions between states in accordance with conventional Viterbi decoding.
Figure 2B:
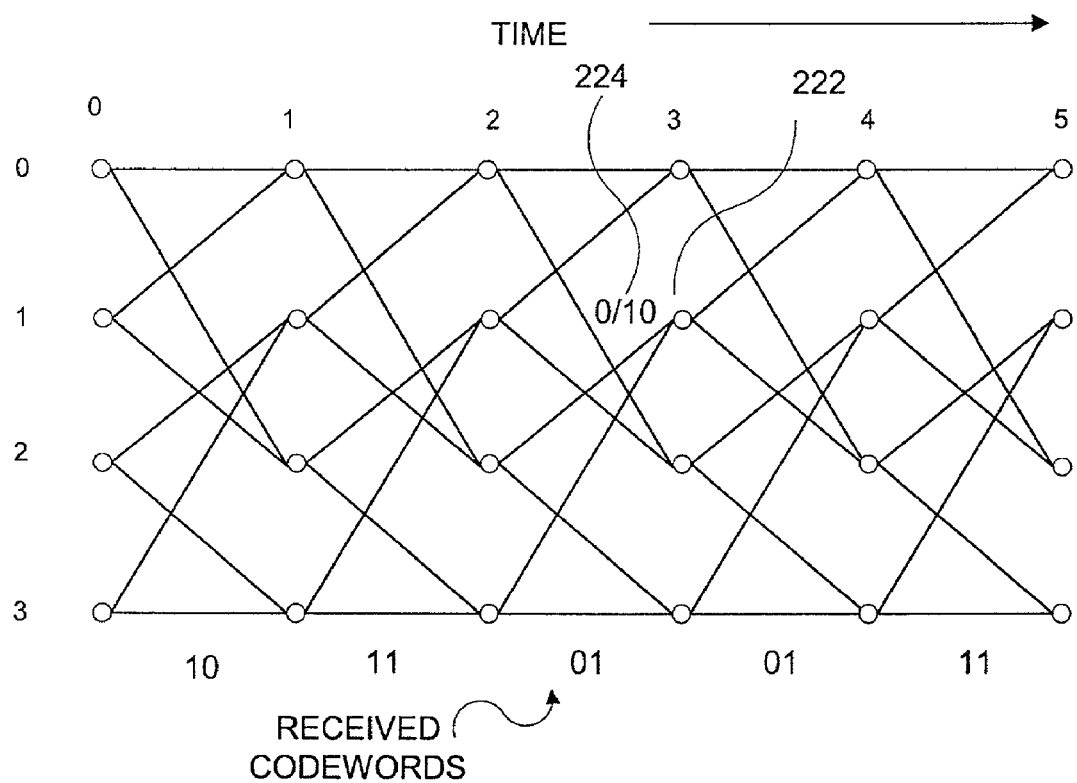
FIG. 2B is a trellis diagram in accordance with conventional Viterbi decoding.
Figure 3:
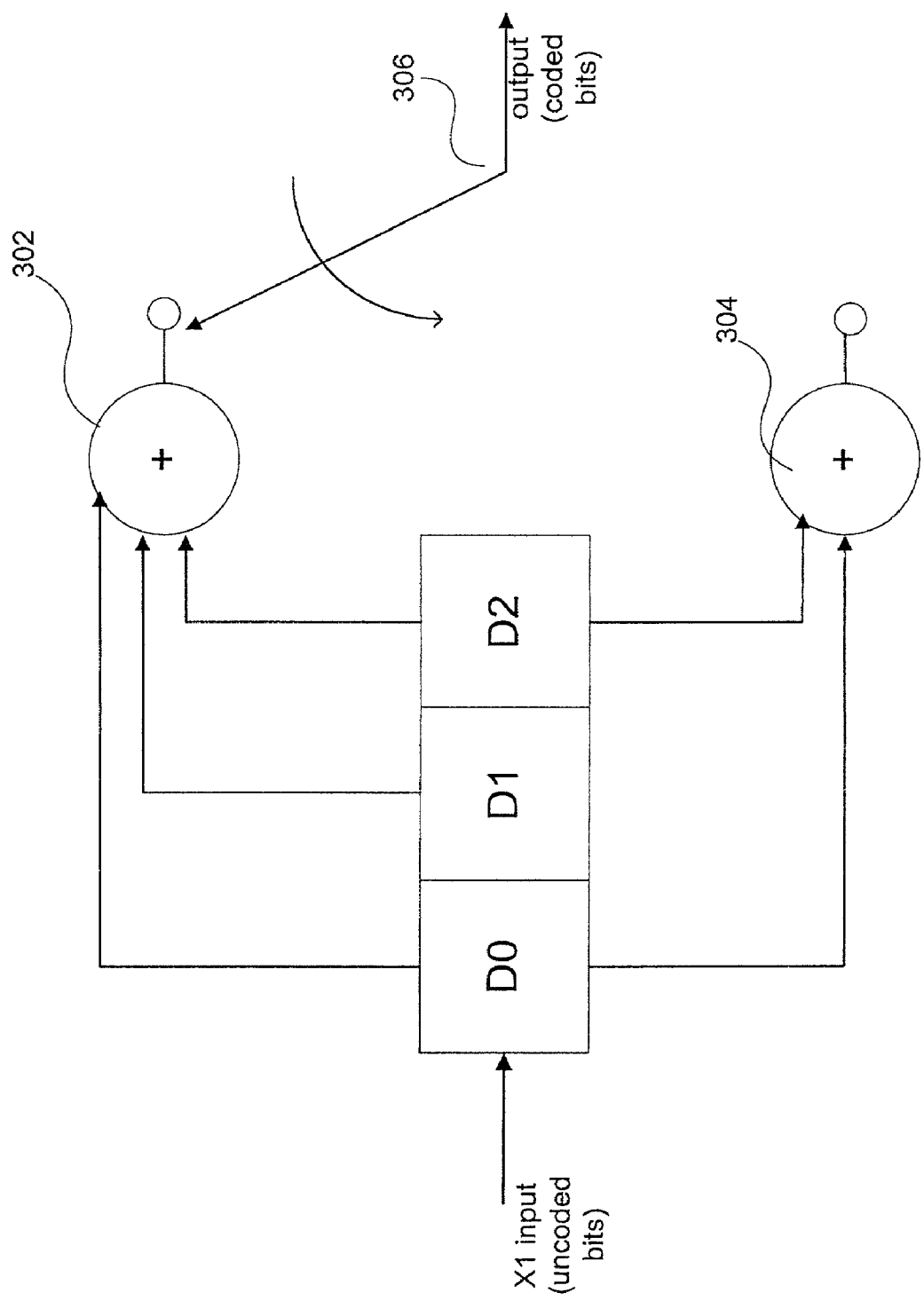
FIG. 3 is a convolutional encoder diagram showing conventional encoding.

In order to decode each bit, the last best metric is examined to determine whether it lies in the top half of the trellis section. This is implemented in one hardware embodiment by "OR"ing the outputs from the bottom half of the trellis section 702 as shown in FIG. 7. The outputs from states 4, 5, 6, and 7 are connected to the input of OR gate 704. Thus, if a "1" (a "1" value for a node corresponds to a path going through a particular node) appears in the bottom half of the initial states of the first (leftmost) trellis section, the OR gate will decode a "1" bit. Combinational logic performing the "OR" function would propagate a "1" value to the shift register 710–713 if any of the lower registers contained an active value (e.g., a "1"). Thus, the traceback logic circuitry 500 shown in FIG. 5, for example, may be connected to the "OR" gate 704 to decode the bits. The "OR"ing function works because the trellis diagram is configured such that in transitioning from a first state to a next state, branching to the lower nodes (or registers) will occur only upon receipt of an active bit (e.g. a "1" value). This is a simplified circuit method for achieving the reverse lookup of a state table such as shown in FIG. 1B.

The methods and apparatus described above may be used to implement a Viterbi decoder in a minimized hardware configuration. Although the configurations have been described in the context of multiplexers and trace registers, the present invention is not limited to the use of such hardware. The invention is equally applicable to configuration using other data selection blocks and other trace or storage registers such as but not limited to flip flops, other types of registers, memory devices, and/or configured programmable logic devices. It should be understood that the principals of the present invention in all of its embodiments may also be extended to include implementation in programmable logic devices in a variety of ways and including the use of look-up tables to perform logic functions. The present invention is intended to cover all such embodiments. The descriptions above are also not limited to a single encoding rate. The embodiments of this invention are expandable to all code rates k/n, where k may be greater than 1.

For increased throughput, one embodiment of the present invention combines parallel traceback circuits such as shown in FIG. 5 with multiple memory blocks to build a continuous traceback circuit producing one decoded bit per clock cycle.

Figure 8:
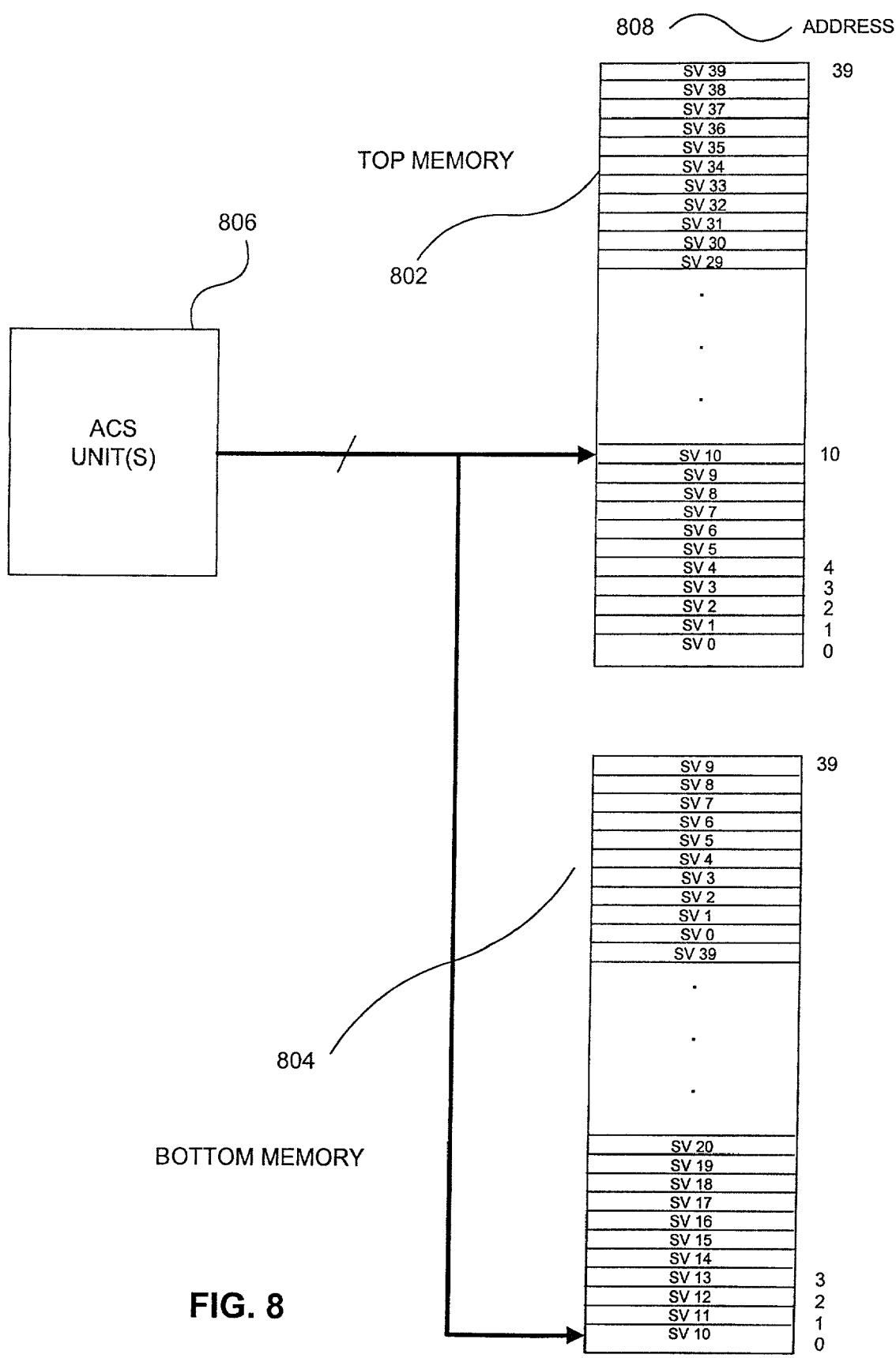
FIG. 8 illustrates multiple memory blocks in accordance with one embodiment of the present invention.

As indicated in FIG. 8, an example of two identical dual port memories, top memory 802 and bottom memory 804, each 4*v words deep are utilized to store the survivor vectors generated by the forward movement through the Viterbi diagram. Although the example describes two memories and two ports, the invention is not so limited. Additional memories and ports may be added to the same implementation to enhance the performance. The memory words are a width corresponding to the number of states, here $2^{(L-1)}$. V is the trellis depth or traceback length. Top memory 802 contains the identical information as bottom memory 804. However, the information in the top memory 802 is offset by v memory locations from the identical information in the bottom memory 804. For example, survivor vector 10 is stored in the first memory location in the bottom memory 804, but stored at memory location 1+v in the top memory 802. The top and bottom memories are provided to allow continuous processing of the received bits and the memory offsets permit the separate memories to traceback different data bits during a set of v clock cycles.

The multiple memory structure shown achieves high-speed traceback by continually writing survivor vector data while decoding multiple (v) bits from one traceback. The top memory 802 and bottom memory 804 are connected to add-compare-select ("ACS") unit 806. The ACS unit(s) computes accumulated path metrics, branch metrics, and survivor vectors as processing proceeds forward through the Viterbi trellis. Although one ACS unit 806 is shown, it is understood by those skilled in the art that any number of ACS units 806 may be connected in parallel to increase the rate of generation of survivor vectors and connected with appropriate switching mechanisms to direct the vectors to memory storage units. In one high speed embodiment, $2^{(L-1)}$ ACS units operate in parallel. For example, 8 ACS units may be configured to operate in parallel to enhance performance. The ACS units are limited to writing survivor vectors to the memory in one embodiment. Branch metrics are kept internally in the ACS units and in one embodiment, only the current values.

Typically, as in the case where 2 connections flow into each node, a $2^{(L-1)}$ bit survivor vector is produced per symbol set received. A serial processing Viterbi decoder requires $2^{(L-1)}$ clocks per symbol set received. Thus, for example where the constraint length L=4, an 8-bit survivor vector is produced and 8 clocks would be required by a serial Viterbi decoder, in one embodiment, to perform the ACS calculations. Therefore, in order to provide sufficient input to the traceback circuit to generate a decoded bit at every clock signal, 8 (i.e. $2^{(L-1)}$) ACS units 806 ideally would be connected in parallel to provide the necessary throughput.

Figure 9A:
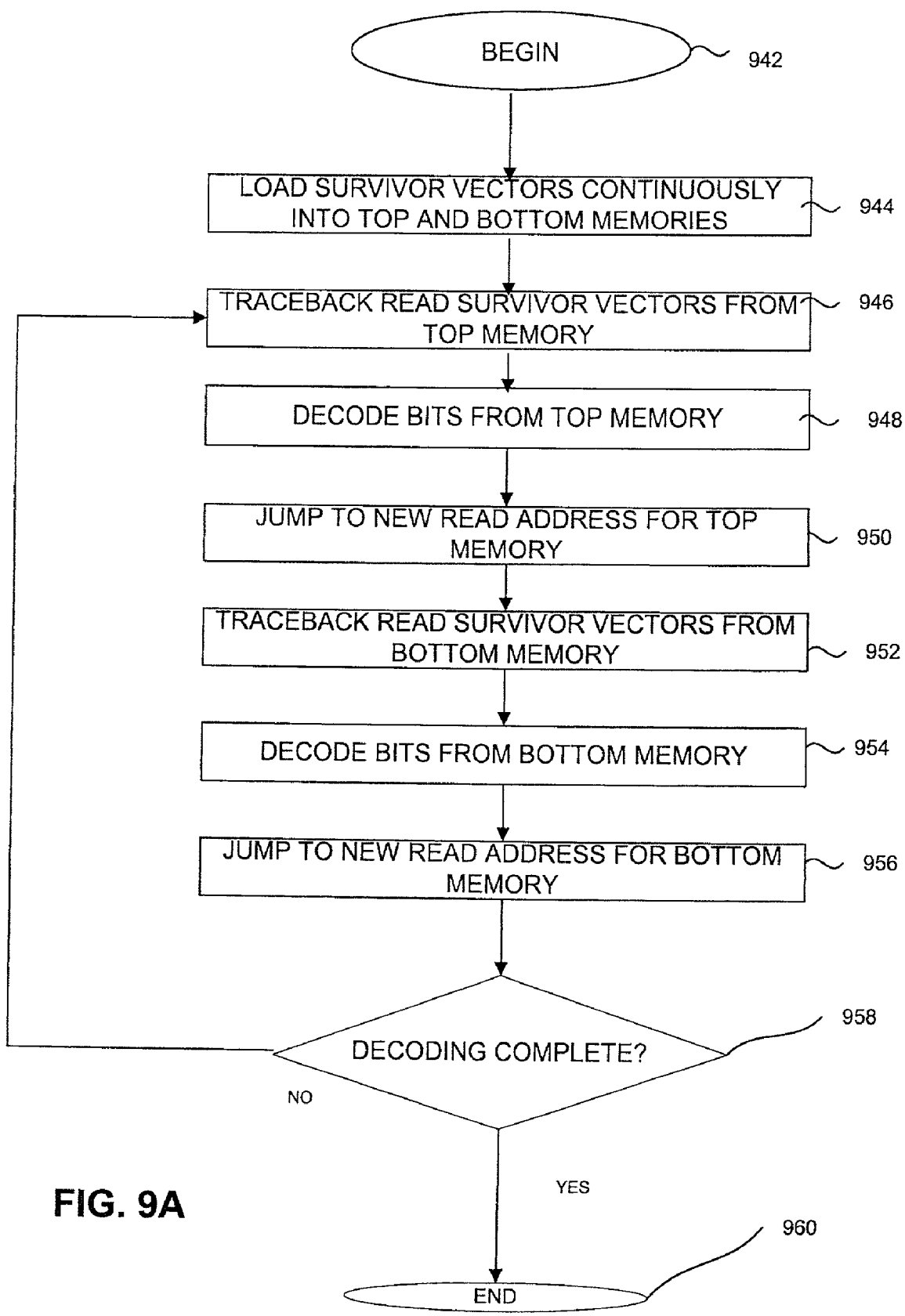
FIG. 9A is a flowchart illustrating a method for using multiple memory blocks to decode data in accordance with one embodiment of the present invention.

FIG. 9A is a flowchart illustrating a method for using multiple memory blocks to decode data in accordance with one embodiment of the present invention. As shown in FIG. 9A, survivor vectors are continuously loaded into both the top memory and the bottom memory (944). The memories, as illustrated in FIG. 8, are dual port memories, allowing reading of the survivor vectors to take place simultaneously with the writing of new survivor vectors. A traceback read of survivor vectors initially takes place in the top memory (946). A traceback cycle may be defined as working backwards through logic representative of a trellis diagram until sufficient branches along the most likely path have been traveled and a bit may be decoded. According to one embodiment, at least v (the traceback depth) survivor vectors must be read in a traceback cycle before decoding occurs. After traceback occurs using v survivor vectors, for example in a circuit such as shown in FIG. 5, traceback decoding of bits occurs for that traceback cycle (948). Once decoding for a traceback cycle is complete, control is directed to a new read address in the top memory for a subsequent traceback cycle (950). Traceback reading of survivor vectors from the bottom memory commences subsequent to the traceback reading from the top memory (952). In a manner similar to the read process in the top memory, decoding of bits from a bottom memory occurs only after traceback reading of v vectors from the bottom memory (954). Once the bits for that traceback cycle have been decoded, control is directed to a new read address in the bottom memory (956). Ideally, the decoding of bits will occur continuously with, in one embodiment, one bit decoded per clock cycle. In this embodiment, the decoding will alternate between the top memory in block 948 and the bottom memory in block 954. Steps 944–956 repeat until a determination is made that decoding is complete (958).

Figure 9B:
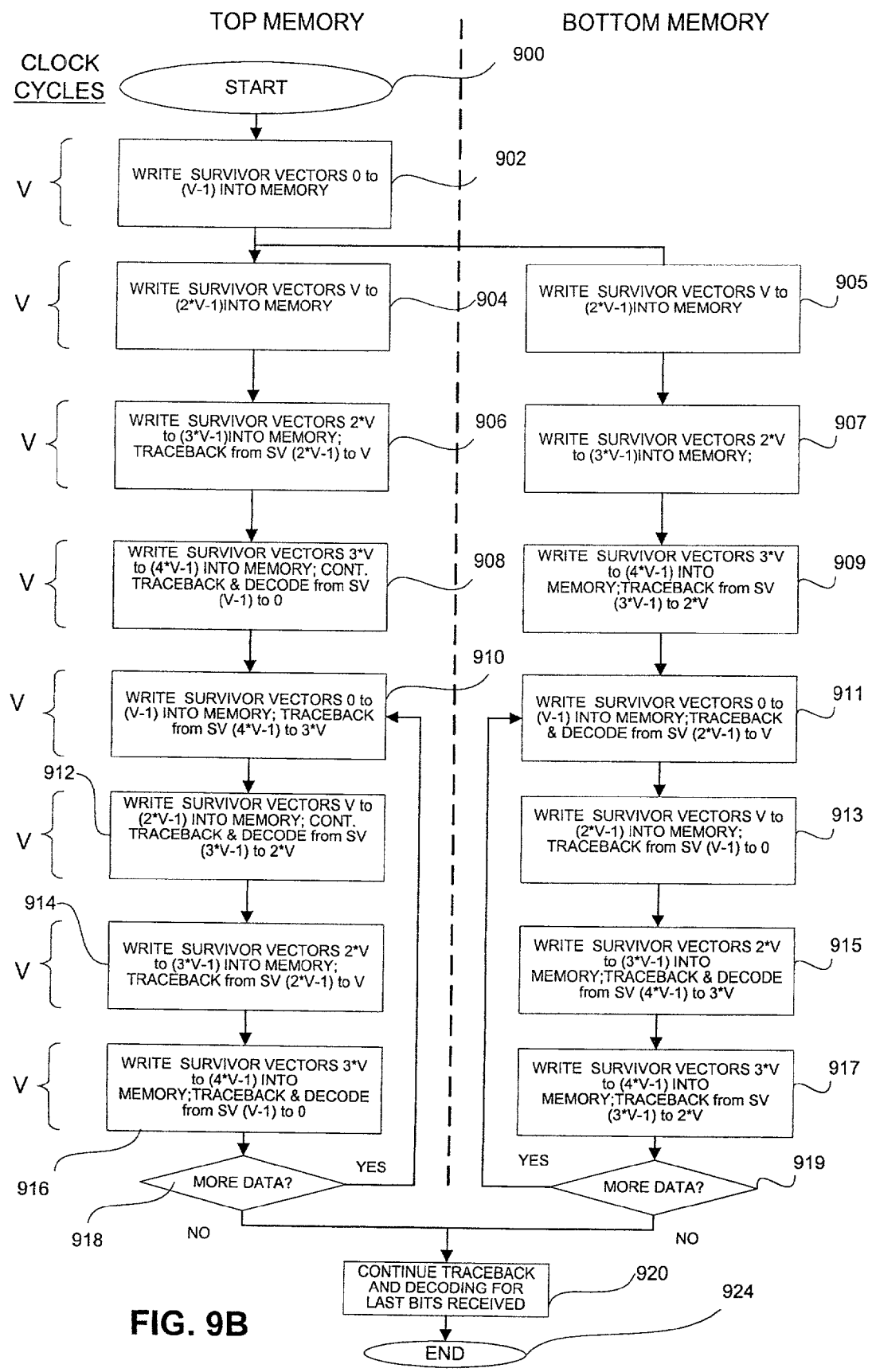
FIG. 9B is a flowchart illustrating in greater detail the method for using multiple memory blocks to decode data shown in FIG. 9A and in accordance with one embodiment of the present invention.

FIG. 9B is related to FIG. 9A and is a flow chart illustrating the process of using two memories to achieve a throughput of one decoded bit per clock cycle, illustrating in greater detail steps of the flowchart of FIG. 9A. Initially, the top memory is loaded with survivor vectors 0 to v−1 as generated by parallel ACS units as the algorithm proceeds in the forward direction (902). Generation of one survivor vector per clock cycle results in the storage of v survivor vectors in v clock cycles. Each of the steps 902 through 917 in FIG. 9B is shown as consuming v clock cycles. Although the survivor vectors are shown written simultaneously to the top memory and the bottom memory (Compare steps 904 and 905, etc.), the respective survivor vectors will be offset by v memory locations in the two memory blocks. For example, as shown in FIG. 8, survivor vector 10 will be stored at memory address 10 (equivalent to v) in the top memory 802 but at memory address 0 in the bottom memory 804. No operation is shown occurring during step 902 to the bottom memory since the initial writing of the first v survivor vectors is necessary to achieve the v offset between memories described above.

During the next v clock cycles survivor vectors v to (2*v−1) are written into the top and bottom memories (904, 905). Although the flowchart shows the writing of these v vectors in v clock cycles, it is recognized by those skilled in the art that the invention may be applied to the typical circuit operation where a uniform clock is applied to a circuit. Thus, as described by steps 904 and 905, survivor vector v will be written during clock cycle v+1 and survivor vector v+1 will be written during clock cycle v+2. The invention is not limited to single clocks per cycle and may be extended to, for example, reading and writing of values during multiple clocks cycles or multiple reads and writes during a single clock cycle.

In the embodiment shown, the two identical dual port memories are each 4*v words deep. The traceback length v represents the minimum length of the Viterbi trellis in order to obtain adequate convergence. Traceback for the top memory commences once 2*v survivor vectors ("SV") have been written into the top memory (906). Although traceback commences in step 906 (starting with SV (2*v−1) and ending with SV v), decoded bits cannot be generated until the full (v) length of the Viterbi trellis has been subjected to traceback. Since dual port memories are used, survivor vectors continue to be written even while traceback and decoding takes place. Concurrently, survivor vectors are written to the bottom memory but no traceback or decoding takes place since 2*v survivors are not written to the bottom memory until the completion of this initialization step (907).

Once the traceback of the top memory has completed v traceback cycles, sufficient traceback has occurred for the output of decoded bits (908). For illustration purposes, FIG. 9 shows decoding to occur initially after v+1 traceback time periods, decoding one bit for each traceback time period (v−1) to 0. In Viterbi decoding the exact time that traceback starts and ends is not critical, as long as all of the tracebacks start and end with the same relative time between them. The decoded bits will have a minimum traceback depth of v up to a traceback depth of 2*v. The average traceback length as shown is 1.5*v. Although the traceback operation has been described as a v traceback operation, the quality of traceback is higher for most of the decoded bits. The actual traceback length of a decoded bit will vary with each clock cycle. While v bits are decoded from the top memory (908), traceback of v trellis sections commences using v survivor vectors from the bottom memory (909).

During the next v clock cycles, traceback continues with decoding of v bits from the bottom memory (using survivor vectors (2*v−1) to v) (911) while traceback of survivor vectors SV (4*v−1) to 3*v commences in preparation for decoding of bits during the following v clock cycles (910). As illustrated in blocks 910 to 917, survivor vectors continue to be written simultaneously into the top and bottom memories, preferably one during each clock cycle.

As shown in steps 908, 911, 912, 915, and 916, decoded bits are generated alternately from tracebacks using the top and bottom memories. Initially v bits (corresponding to SV (v−1) to 0) are decoded from a top memory traceback (908) followed by v bits (corresponding to SV (2*v−1) to v) from a bottom memory traceback (911), v bits (corresponding to SV (3*v−1) to 2*v) from a top memory traceback (912), v bits (corresponding to SV (4*v−1) to 3*v) from a bottom memory traceback (915), and again to v bits (corresponding to SV (v−1) to 0) from a top memory traceback (916). These bits are written in one embodiment to an output RAM.

Both the top and bottom memories write 2*v survivor vectors into memory before traceback occurs. For example, once SV (4*v−1) has been written into memory (908), traceback of 2*v vectors (from 4*v−1 to 2*v) occurs, with bits being decoded only from 3*v−1 to 2*v (910 and 912). In similar fashion traceback of 2*v survivor vectors occurs in steps 914 and 916, steps 911 and 913, ands steps 915 and 917.

The reading and writing operations are modulo 2*v but the memory length requirements are greater than 2*v. In situations where memories are pipelined, read or write cycles may take effect 1 to 2 clocks after the address has been applied. A memory 4*v in length provides a comfortable margin to separate read and write data and prevents unread survivor vector data from being overwritten by new survivor data.

The traceback cycles will repeat indefinitely after the writing of the first 2*v survivor vectors. As further shown in FIG. 9, a determination of additional survivor vector data (918, 919) will result in the continuation of the writing and traceback operations 910–917. Even where the data input has stopped, several cycles will be required to traceback and decode the data already written into the top and bottom memories (920).

Figure 10:
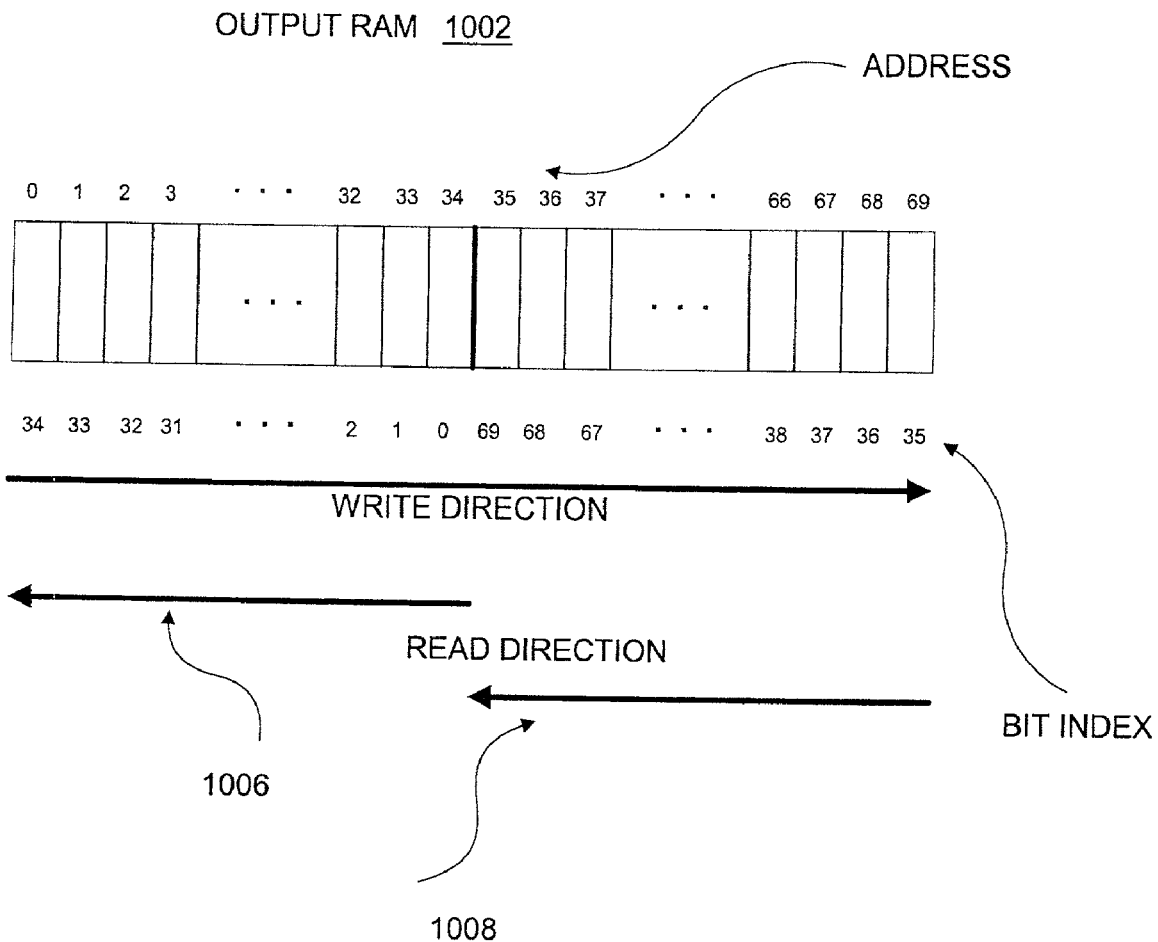
FIG. 10 illustrates an output RAM in accordance with one embodiment of the present invention.

FIG. 10 illustrates an output RAM for use with the multiple memories described above and the flowchart illustrated in FIG. 9. In one embodiment the output RAM 1002 is 2*v bits deep and 1 bit wide. The first decoding operation, as illustrated in step 908 in FIG. 9, decodes v bits but in reverse order. These v bits are written to the output RAM commencing with address 0. When the v bits have been written to the output RAM the writing of the bits from the bottom traceback (from the bottom memory) commences and the modulo 2*v write counter continues to count. Thus, when the write counter is between 0 and v−1, it is writing bits from the top traceback. Otherwise (from v to (2*v−1)) it is writing bits from the bottom traceback.

After the first v bits are written, the modulo 2*v read counter counts down, commencing with the value v−1. Once the read counter reaches 0, the value wraps to the next value of 2*v−1, where in the previous clock cycle the lowest indexed bit from the bottom traceback had been written. As shown by read arrows 1006 and 1008, this method and configuration places the decoded output bits in the correct order to correspond to the bit order sent in the transmitted signal.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A Viterbi decoder comprising:
at least two data selection blocks, each of the at least two data selection blocks having at least two inputs, an output, and control circuitry;
at least two trace registers each having an input and an output, wherein the output of each of the at least two trace registers is connected to an input of one of the at least two data selection blocks and the input of each of the at least two trace registers is connected to an output of a corresponding data selection block; and
circuitry for transmitting survivor vector values from a forward movement through a Viterbi trellis to the control circuitry for each of the at least two data selection blocks to select a signal corresponding to one of the inputs of the data selection block to appear at the output in order to select a predecessor best metric state in a traceback.

2. The Viterbi decoder described in claim 1, wherein the connection from the output of one of the at least two trace registers to an input of one of the at least two data selection blocks corresponds to the connection between one of a plurality of current states and one of its predecessor states in a traceback of the Viterbi trellis.

3. The Viterbi decoder described in claim 1, wherein the survivor vector values are determined by add-compare select circuitry from received encoded data in the forward movement through the Viterbi trellis.

4. The Viterbi decoder described in claim 1, wherein the number of trace registers corresponds to a constraint length L of an encoder used to encode data into one of $2^{(L-1)}$ states, wherein L is an integer.

5. The Viterbi decoder described in claim 1, wherein the number of trace registers is equal to the number of data selection blocks.

6. The Viterbi decoder described in claim 2, wherein a current state having the best metric is represented by an active value in the trace register corresponding to that state.

7. The Viterbi decoder described in claim 1, wherein the data selection blocks comprise multiplexers.

8. The Viterbi decoder described in claim 1, wherein the trace registers are configured to operate sequentially to store values received at their inputs upon detection of a predetermined electrical clock signal or signal change, each sequential value corresponding to a predecessor state for a current state, as traced in a Viterbi trellis diagram.

9. The Viterbi decoder described in claim 1, wherein a predetermined portion of the survivor vector identifies a predecessor state for a current state, said portion comprising at least one bit.

10. The Viterbi decoder described in claim 1, further configured to identify the predecessor best metric state to a current best metric state by using the predetermined portion of the survivor vector corresponding to the current best metric state to control the control circuitry for each of the at least two data selection blocks to select a signal corresponding to one of the inputs of the data selection block to appear at the output.

11. The Viterbi decoder described in claim 1, wherein the trace registers comprise a flip flop.

12. The Viterbi decoder described in claim 1, further comprising a memory for storage of survivor vector values, the memory having at least two ports.

13. The Viterbi decoder described in claim 12, wherein the memory is set up as a circular buffer.

14. The Viterbi decoder described in claim 13, further configured so that the sequence of survivor vectors read from memory corresponds to the survivor states determined in the forward movement through the Viterbi trellis.

15. The Viterbi decoder described in claim 1, further configured to generate a decoded bit by performing a logical "OR" operation on the bits output from the trace registers corresponding to the lower half of the Viterbi trellis.

16. The Viterbi decoder described in claim 1, further configured to generate at least two decoded bits during each traceback cycle.

17. The Viterbi decoder described in claim 1, wherein a traceback length used to generate a second of the at least two decoded bits during each traceback cycle is one larger than the traceback length used to generate the first of the at least two decoded bits, and each succeeding bit decoded during said traceback cycle uses a traceback length one larger than used for the preceding decoded bit.

18. The Viterbi decoder described in claim 1, wherein the number of bits decoded per traceback cycle corresponds to the next integer value rounded up from the result of the traceback length selected divided by a constraint length of an encoder used to encode data to more efficiently match the decoding rate with the survivor vector generation rate.

19. The Viterbi decoder described in claim 16, further comprising a serial shift register to reverse the order of the decoded bits generated during each traceback cycle.

20. The Viterbi decoder described in claim 1, wherein the decoder is configured within a programmable logic device.

21. A Viterbi decoder for performing a continuous traceback comprising:
a traceback circuit; and
at least two memory blocks, each having at least two ports and each having a word depth of at least about 4 times the traceback length of the decoder, and wherein each word of memory stores a survivor vector for a time period in the traceback, and wherein the decoder is configured to
write survivor vectors into the at least two memories simultaneously but offset by a distance in memory locations from the memory location in an adjacent memory block equal to about the traceback length, and
read, in a traceback mode, the survivor vectors in groups alternately selected from each of the at least two memory blocks.

22. The Viterbi decoder described in claim 21, wherein the traceback circuit comprises:
at least two data selection blocks, each of the at least two data selection blocks having at least two inputs, an output, and control circuitry;
at least two trace registers having an input and an output, wherein the output of each of the at least two trace registers is connected to an input of one of the at least two data selection blocks and the input of each of the at least two trace registers is connected to an output of a corresponding data selection block; and
circuitry for transmitting survivor vector values corresponding to a forward movement through a Viterbi trellis and read from the at least two memories to the control circuitry for each of the at least two data selection blocks to select a signal corresponding to one of the inputs to appear at the output.

23. The Viterbi decoder described in claim 21, further comprising an add-compare-select circuit to generate and transmit survivor vectors to the at least two memory blocks.

24. The Viterbi decoder described in claim 21, wherein the survivor vectors are written continuously to the at least two memory blocks.

25. The Viterbi decoder described in claim 21, further comprising an output memory having at least two ports for storing decoded bits generated in a reversed order.

26. The Viterbi decoder described in claim 21, further configured to:
   commence a first traceback cycle when at least about 2*v survivor vectors have been written into one of the at least two memories and to generate a decoded bit after at least about v survivor vectors have been read after commencement of the first traceback cycle, where v is an integer value of the traceback length;
   commence a second traceback operation cycle substantially concurrently with the commencement of generation of decoded bits in the first traceback cycle; and
   generate decoded bits from the second traceback operation after at least about v survivor vectors have been read from the time of commencement of the second traceback cycle.

27. The Viterbi decoder described in claim 26, wherein the second traceback cycle commences traceback on survivor vectors written about v clock cycles later than the survivor vectors used for the first traceback cycle.

28. The Viterbi decoder described in claim 26, wherein at least about v decoded bits are generated during each of the first traceback cycle and the second traceback cycle.

29. The Viterbi decoder described in claim 26, wherein groups of at least v bits are decoded and written to the output memory alternately from the first traceback cycle and the second traceback cycle.

30. The Viterbi decoder described in claim 21, further comprising a read counter having the number of states corresponding to 2 times the traceback length and wherein the decoder is further configured to read decoded bits from the output memory by counting down using the read counter.

31. The Viterbi decoder described in claim 21, wherein the decoder is configured within a programmable logic device.

32. A method for traceback decoding comprising:
   designating a current state as the state having the best metric by using at least two trace registers each having an input and an output, wherein the output of each of the at least two trace registers is connected to an input of one of at least two data selection blocks and the input of each of the at least two trace registers is connected to an output of a corresponding data selection block and wherein the connection from the output of one of the at least two trace registers to an input of one of the at least two data selection blocks corresponds to the connection between one of the current states and one of its predecessor states in a traceback of the Viterbi trellis;
   selecting a predecessor state to the current state by using a survivor vector corresponding to the predecessor state, wherein the survivor bits corresponding to the predecessor states determine which of the potential predecessor states was the surviving state, and by controlling the inputs to at least one of the at least two data selection blocks; and
   determining a new current state using an active value transmitted from the output of one of the at least two data selection blocks to the input of one of the at least two trace registers.

33. The method for traceback decoding described in claim 32, further comprising designating a current state, selecting a predecessor state, and determining a new current state until the traceback has been completed.

34. A method for performing continuous traceback decoding comprising:
   writing surviving vectors continuously into each of at least a first and a second memory having at least two ports, each having a word depth of at least 2 times the traceback length v;
   performing a traceback from the first memory for a number of time periods corresponding to the traceback length v without generating decoded bits from that traceback;
   continuing the traceback from the first memory and decoding v bits sequentially from a traceback cycle of said first memory, the traceback length for the v bits varying from v to 2*v, wherein v is an integer;
   performing a traceback from the second memory for v cycles without generating decoded bits from that traceback simultaneously while decoding v bits from the first memory, wherein the traceback commences on survivor vectors written v cycles later than the survivor vectors used for the traceback operation performed on the first memory; and
   continuing the traceback from the second memory and decoding v bits sequentially from a traceback cycle of said second memory, the traceback length generating each of the v bits varying from about v to 2*v.

35. A computer program product comprising:
   a machine readable medium having stored thereon program instructions for a method of performing traceback decoding, the method comprising:
      designating a current state as the state having the best metric by using at least two trace registers each having an input and an output, wherein the output of each of the at least two trace registers is connected to an input of one of at least two data selection blocks and the input of each of the at least two trace registers is connected to an output of a corresponding data selection block and wherein the connection from the output of one of the at least two trace registers to an input of one of the at least two data selection blocks corresponds to the connection between one of the current states and one of its predecessor states in a traceback of the Viterbi trellis;
      selecting a predecessor state to the current state by using a survivor vector corresponding to the predecessor state, wherein the survivor bits corresponding to the predecessor states determine which of the potential predecessor states was the surviving state, and by controlling the inputs to at least one of the at least two data selection blocks; and
      determining a new current state using an active value transmitted from the output of one of the at least two data selection blocks to the input of one of the at least two trace registers.

36. A computer program product comprising:
   writing surviving vectors continuously into each of at least a first and a second memory having at least two ports, each having a word depth of at least 2 times the traceback length v, wherein v is an integer;

performing a traceback from the first memory for a number of time periods corresponding to the traceback length v without generating decoded bits from that traceback;

continuing the traceback from the first memory and decoding v bits sequentially from a traceback cycle of said first memory, the traceback length for the v bits varying from v to 2*v;

performing a traceback from the second memory for v cycles without generating decoded bits from that traceback simultaneously while decoding v bits from the first memory, wherein the traceback commences on survivor vectors written v cycles later than the survivor vectors used for the traceback operation performed on the first memory; and continuing the traceback from the second memory and decoding v bits sequentially from a traceback cycle of said second memory, the traceback length generating each of the v bits varying from about v to 2*v.

* * * * *